United States Patent [19]

Wei et al.

[11] Patent Number: 5,400,505

[45] Date of Patent: Mar. 28, 1995

[54] METHOD FOR MANUFACTURING FIBER-REINFORCED COMPONENTS FOR PROPULSION PLANTS

[75] Inventors: William Wei, Munich; Wolfgang Krüger, Reichertshausen, both of Germany

[73] Assignee: MTU Motoren- und Turbinen-Union München GmbH, Munich, Germany

[21] Appl. No.: 276,940

[22] Filed: Jul. 19, 1994

[30] Foreign Application Priority Data

Jul. 23, 1993 [DE] Germany .................. 43 24 755.5

[51] Int. Cl.⁶ .............................................. B23P 15/00
[52] U.S. Cl. ................................. 29/889.2; 29/889.7; 29/460
[58] Field of Search ................ 29/889, 889.2, 889.7, 29/889.71, 889.72, 458, 460, 527.2; 428/614; 228/190

[56] References Cited

U.S. PATENT DOCUMENTS

| | | | |
|---|---|---|---|
| 2,477,375 | 7/1949 | Jablonsky | 29/889.72 |
| 3,841,942 | 10/1974 | Carlson et al. | 156/436 |
| 4,499,156 | 2/1985 | Smith et al. | 428/614 |
| 4,709,457 | 12/1987 | Broquere et al. | 29/889.2 |
| 4,733,816 | 3/1988 | Eylon et al. | 228/190 |

FOREIGN PATENT DOCUMENTS 2063721  6/1981  United Kingdom ............... 29/889.2

*Primary Examiner*—Irene Cuda
*Attorney, Agent, or Firm*—W. G. Fasse; W. F. Fasse

[57] ABSTRACT

In a method of manufacturing fiber-reinforced engine components having a metal matrix, a long or even continuous silicon carbide fiber is first coated with a matrix metal of a titanium-based alloy by atomizing or sputtering. Then, the fibers coated with matrix material are wound onto a mold in the direction of the anticipated stresses. A covering of foils, bands, wires, pressed-on granulates, sintered-on powders or a top coating of matrix metal is then applied onto the surface of the fibers wound onto the mold. Finally the mold with the wound-on, matrix-material coated fibers and the covering of matrix metal is subjected to hot isostatic pressing. This method is used to manufacture engine shafts, shroud bands for turbine wheels or disk-less turbine wheels having retaining rings holding the blades.

20 Claims, 1 Drawing Sheet

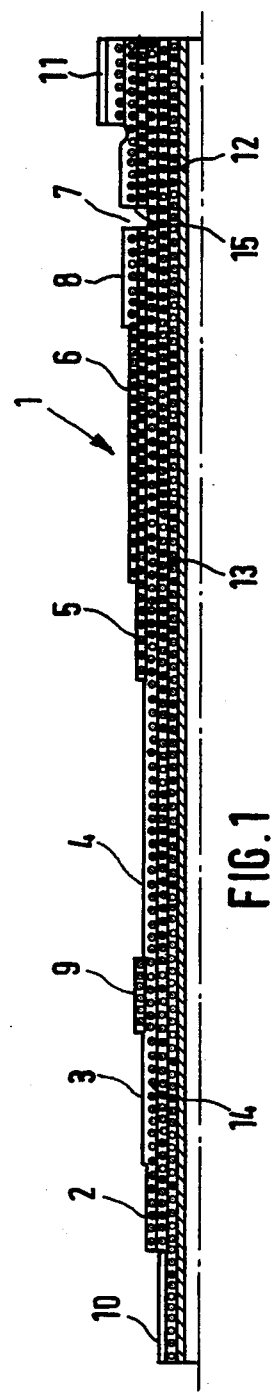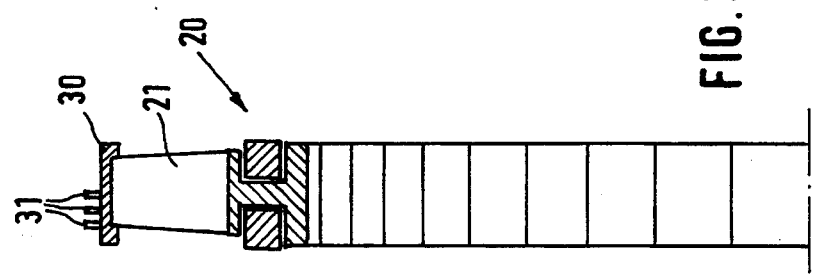

METHOD FOR MANUFACTURING FIBER-REINFORCED COMPONENTS FOR PROPULSION PLANTS

FIELD OF THE INVENTION

The invention relates to a method of manufacturing fiber-reinforced engine components, especially jet engine components, having a metal matrix.

BACKGROUND INFORMATION

The manufacture of fiber-reinforced foils, sheets or bands having a metal matrix is known, and is described in U.S. Pat. Nos. 4,499,156 and 4,733,816, for example. As described therein, silicon carbide fibers, silicon-coated silicon carbide fibers, silicon-carbide-coated boron fibers or boron-carbide-coated boron fibers are used as reinforcement materials and foils, sheets or bands of titanium-based alloys are used as the metal matrix. In such prior art, the metal matrix is hot-pressed between and onto the fibers using an apparatus of the type disclosed in U.S. Pat. No. 3,841,942. The disadvantage of using such foils, sheets or bands as the matrix is that further processing to manufacture annular engine components can be suitably carried out only for the simplest ring geometries and cross-sections. It is impossible to use fusion or smelting metallurgy to manufacture more complex ring or shaft cross-sections, which are typical in jet engine components, because of the powerful reaction of the molten titanium with the silicon carbide fibers.

The known hot-pressing method has the disadvantage that it is relatively costly because it requires many steps to build up the fiber/foil structure. Furthermore, the highest achievable volume percentage of fibers and the resultant mechanical properties of the component are limited because it is impossible to achieve the densest packing of the fibers. The distance or spacing between the fibers cannot be held constant and contact between fibers cannot always be avoided. Fiber contact and broken fibers lead, inter alia, to fatigue cracks and shortening of the operating life of the engine components. The intended alignment of the fibers in the desired or necessary directions is likewise possible only to a limited extent.

OBJECTS OF THE INVENTION

In view of the foregoing it is the aim of the invention to achieve the following objects singly or in combination:

to provide a method by which cylindrical or annular engine components with complex cross-sections may be manufactured from fiber-reinforced titanium-based alloys with a high volume percentage of fibers and an assured spacing between the fibers;

to provide such a method that is relatively simple and includes fewer total steps as compared to prior art methods;

to help prevent rubbing contact and breaking of reinforcing fibers in engine components manufactured according to such a method, and thereby increase the operating life of such engine components;

to individually coat and surround each reinforcing fiber in a fiber-reinforced engine component manufactured according to the present method, in order to ensure a uniform distribution of reinforcing fibers and matrix material and allow an accurate control and selection of a desired proportion between reinforcing fibers and matrix material over a wide range of proportions; and to provide a method of manufacturing a disk-less turbine wheel having blades held by continuous annular rings, produced according to the present method.

SUMMARY OF THE INVENTION

The above objects have been achieved by a method according to the invention, carried out as follows: first, coating a long or even continuous silicon carbide fiber with a matrix metal comprising a titanium-based alloy by dusting, atomizing, sputtering or evaporation-coating; secondly, winding the fibers coated with matrix material onto a mold, preferably a cylindrical or annular preform of an engine component, at defined angles relative to the preform axis, for example in the direction of the anticipated stresses; thirdly, applying an at least partial covering by means of foils, bands, pressed-on granulates, sintered-on powders, wires or an atomized surface coating of matrix metal onto the surface of the windings of the wound mold or preform; and finally, hot isostatic pressing the mold including the wound-on, matrix-metal-coated fibers and the covering of matrix metal. Manufacturing components by winding with a continuous, matrix metal-coated fiber followed by hot isostatic pressing offers considerable advantages over the known manufacturing methods, in which fibers without a matrix coating are hot-pressed between sheets or foils of matrix metal. The technique of winding onto a mold individual fibers or a continuous fiber coated with matrix metal makes it possible to manufacture more complex structures, in particular cylindrical components having complex cross-sections, for example having cross-sections that vary in a complex manner over the length of the component. A uniform distance or spacing between the fibers is guaranteed by the coating of matrix material applied to the fibers. A high volume percentage of fibers may be achieved in the component. Moreover, the number of manufacturing steps is reduced to the lowest possible level. Furthermore, the fibers may be wound in any required direction, whereby winding in the direction of the main operating stress advantageously increases the strength in this direction.

Coating the fibers with matrix metal may be carried out either in a static or in a dynamic manner. In the case of static or discontinuous coating, the fibers are laid into windings or looped coils and then coated. To this end, the fibers are wound up cylindrically outside or inside of a spool carrier and are then coated while stationary or rotating, depending on the coating method, in individual coating chambers using a charging method. In the case of dynamic coating, continuous or endless fibers are continuously coated, whereby the continuous fibers are preferably drawn through a plurality of coating zones of a coating apparatus.

In a preferred method, foils or bands of matrix metal are wound, or matrix metal granulates or powders are pressed or sintered, or a coating of matrix metal is applied onto the mold prior to winding on the coated fibers. This has the advantage that, after hot isostatic pressing, the components have on their surface areas facing the mold a thick layer of matrix metal which may subsequently be shaped, cut or smoothed.

Preferably, the volume ratio between fiber material and matrix metal is varied by altering the coating thickness in relation to the fiber diameter. This has the advantage that no matrix material has to be added in powder or foil form, which would otherwise endanger the uniform spacing of the fibers in the matrix material.

A preferred volume ratio between fiber material and matrix metal is set between 1:5 and 1:0.2. Thereby, it is advantageous that the lowest achievable theoretical limit of the volume ratio, namely 1:0.1, can nearly be achieved. Preferably, the volume ratio of fiber to matrix material is between 1:3 and 1:0.45.

In a further preferred method, the mold is made of matrix metal and may therefore advantageously serve as a container during hot isostatic pressing. Thereby the finished components are given external contours free of fibers, which may subsequently be easily machined without disrupting fiber courses.

A preferred use of the method is to manufacture engine shafts such as jet engine shafts. For this purpose, the fiber coated with matrix metal may be wound onto a cylindrical or conical tube or pipe. The most diverse diameter steps, keyways, shaft grooves, and shaft beads may be formed without difficulty during winding. The winding direction of individual winding layers may advantageously be adapted to the load distribution along the shaft.

A further preferred use of the method is to manufacture non-segmented, continuous shroud bands for turbine wheel blades. These shroud bands connect the blade tips and have sealing tips, fins or rings specially formed to protrude from the shroud band toward the turbine housing. In the previously known art, the shroud bands are composed of segments, with each segment being firmly connected to one blade tip. A closed or continuous shroud band in the form of a ring offers considerable advantages over the conventional structure.

The method according to the invention is preferably used to manufacture disk-less turbine wheels comprising retaining rings holding together the blades. Due to the high tensile strength of the components made of fiber-reinforced titanium-based alloys, it is advantageously possible to provide recesses for receiving the supporting or retaining rings at the root of the blades rather than using the conventional heavy turbine disk. When these supporting or retaining rings are manufactured using the method according to the invention, a substantial saving in weight compared to the conventional turbine disk is advantageously achieved.

BRIEF DESCRIPTION OF THE DRAWINGS

In order that the invention may be clearly understood, it will now be described, by way of example, with reference to the accompanying drawings, wherein:

FIG. 1 is a lengthwise axial sectional view through a turbine shaft manufactured by the method of the invention;

FIG. 2 is a transverse view, partially in axial section, of a disk-less turbine wheel according to the invention; and FIG. 3 is a transverse view similar to that of FIG. 2, but additionally showing a continuous shroud band manufactured according to the invention.

DETAILED DESCRIPTION OF PREFERRED EXAMPLE EMBODIMENTS AND OF THE BEST MODE OF THE INVENTION

FIG. 1 shows an axial section through a turbine shaft 1 made of a fiber-reinforced titanium-based alloy and having, formed therein, diameter steps 2, 3, 4, 5 and 6 as well as a groove 7, bearing seats 8 and 9, an input or driving pinion 10 and an output or driven pinion 11.

To manufacture the shaft, long or even continuous silicon carbide fibers are first coated, by sputtering or evaporation-coating, with a matrix metal comprising a titanium-based alloy. For example, Ti6Al4V or TiAl is sputtered onto the silicon carbide fiber at a coating speed of 30 $\mu$m/hour under a partial vacuum of 0.1 mPa until a matrix metal thickness of 30 $\mu$m is reached. For carrying out the coating, the fiber 13, 14, 15 is heated to a temperature of 300° to 600° C.

The fibers 13, 14 and 15 coated with matrix material are then applied by means of a winding apparatus or fiber laying apparatus onto a tube 12 serving as a core or mold that is preferably a preform of an engine component. More specifically, circumferential fibers 14, 15 are wound around the mold tube 12, preferably in a direction of the anticipated operating stresses, while axial fibers 13, if necessary, are laid in a generally longitudinal direction around the tube 12. The wound fibers 14, in order to absorb torsional stresses, are preferably wound in crosswise layers at an angle of 30° to 60° relative to the axial direction of the shaft 1. At each edge area of the steps 2, 3, 4, 5 and 6, and of the groove 7, the fibers 15 coated with matrix -metal are wound at right angles to the shaft axis and held in position during winding by auxiliary molds (not shown).

In the region of the driving or input pinion 10 and the output pinion 11, a covering of foils, bands, wires, pressed-on granulates, sintered-on powders or a top coating of matrix metal is applied onto the surface of the fibers wound onto the mold. The thickness of the covering is dimensioned in such a way that the driving pinion 10 or output pinion 11 may, after hot isostatic pressing, be machined into the covering material layer without contacting or disrupting the underlying fiber material.

Prior to hot isostatic pressing, the fiber-wound mold is introduced into a container. The container material is preferably made of matrix metal so that it is unnecessary to later separate the container and the wound mold, especially when the mold is a tube 12 made of matrix material, as in the present example. Hot isostatic pressing is then carried out on the fiber-wound mold in the container. The hot isostatic pressing of the mold with the wound-on, matrix material-coated fibers and the covering made of matrix material reduces the distance or spacing between the fibers to about 50 $\mu$m.

FIG. 2 shows a transverse view of a disk-less turbine wheel 20. Instead of using a usual turbine wheel disk, in which blades are secured by their blade roots, the invention provides that the blade roots 22 of blades 21 have grooves or recesses 23, which form annular grooves 23 when the blades 21 are aligned and assembled circumferentially next to one another to form the complete turbine wheel. Inserted into these annular grooves 23 are supporting or retaining rings 24 and 25, which are manufactured using the method according to the invention. Namely, the rings 24 and 25 are formed by coating a silicon carbide fiber with a matrix material, winding the coated fiber onto a preform or mold, applying an at least partial covering of matrix material, and then hot isostatic pressing the covered, wound preform. In the turbine wheel 20, these rings 24, 25 replace or take over the function of the much heavier, conventional, turbine wheel disk in an engine, namely they hold the blades 21 in position.

FIG. 3 shows a transverse view of a disk-less turbine wheel 20 similar to that of FIG. 2, but further comprising a continuous shroud band 30. This shroud band 30 encloses the tips of the rotor blades 21 and has sealing tips or fins or rings 31 which form a gland seal between the blade tips and the housing (not shown) of the engine. Both the shroud band 30 and the sealing tips 31 were manufactured using the method according to the invention, for example in a manner similar to the manufacturing of the retaining rings 24, 25 described above. Advantageously, the sealing tips or rings 31 can be formed integrally with the shroud band 30 according to the method of the invention.

Although the invention has been described with reference to specific example embodiments, it will be appreciated that it is intended to cover all modifications and equivalents within the scope of the appended claims.

What is claimed is:

1. A method of manufacturing a fiber-reinforced engine component, comprising:
    a) coating a long silicon carbide fiber with a first matrix layer comprising a titanium-based alloy;
    b) winding the coated fiber onto a form surface of an engine component preform, at an angle relative to the main axis of the preform;
    c) applying at least one of foils, bands, wires, sintered-on powders or atomized coatings of a second matrix alloy onto a surface of the fiber-wound preform to form a cover layer at least partially covering the surface of the fiber-wound preform; and
    d) hot isostatic pressing the covered, fiber-wound preform.

2. The method of claim 1, wherein coating the fiber comprises a discontinuous batch process comprising coiling the fiber and then coating the coiled fiber.

3. The method of claim 1, wherein coating the fiber comprises a continuous process comprising drawing the fiber through at least one coating zone of a coating apparatus.

4. The method of claim 1, further comprising covering the form surface of the preform with at least one of foils, bands, wires, pressed-on granulates, sintered-on powders or a surface coating of a third matrix metal prior to winding the coated fiber onto the preform.

5. The method of claim 4, wherein the third matrix metal comprises the same material as the first matrix layer.

6. The method of claim 1, further comprising controlling the coating thickness of the first matrix layer in relation to the fiber diameter to control a fiber/matrix volume ratio.

7. The method of claim 6, wherein the fiber/matrix volume ratio is controlled to be between 1:3 and 1:0.45.

8. The method of claim 1, wherein the preform is made of a fourth matrix metal.

9. The method of claim 8, wherein the fourth matrix metal comprises the same material as the first matrix layer.

10. The method of claim 1, wherein the first matrix layer comprises the same material as the second matrix alloy.

11. The method of claim 1, wherein the long silicon carbide fiber is a continuous fiber.

12. The method of claim 1, wherein the titanium-based alloy of the first matrix layer is one of TiAl and Ti6Al4V.

13. The method of claim 1, wherein coating the fiber comprises one of sputtering, atomizing and evaporating coating.

14. The method of claim 1, further comprising heating the fiber to a temperature in the range from 300° C. to 600° C. before the coating step.

15. The method of claim 1, further comprising applying a layer of the coated fiber oriented substantially parallel to the main axis of the preform.

16. The method of claim 1, wherein the angle of winding the fiber onto the preform is in the range from 30° to 60°.

17. The method of claim 1, wherein the angle of winding the fiber onto the preform is the same as an angle of maximum operating stress in the engine component.

18. The method of claim 1, wherein the engine component is an engine shaft, and the method further comprises a final machining step to form the engine shaft from the pressed, covered, fiber-wound preform.

19. The method of claim 1, wherein the engine component is a continuous circumferential shroud band for a turbine, and the method further comprises assembling the shroud band together with a plurality of turbine blades to hold and interconnect the blades.

20. The method of claim 1, wherein the engine component is a retaining ring for blades of a disk-less turbine, and the method further comprises assembling the retaining ring in an annular groove in roots of the blades.

* * * * *